(12) United States Patent
Lu et al.

(10) Patent No.: US 8,282,993 B2
(45) Date of Patent: Oct. 9, 2012

(54) ULTRATHIN MAGNESIUM NANOBLADES

(75) Inventors: Toh-Ming Lu, Loudonville, NY (US);
Gwo-Ching Wang, Loudonville, NY (US); Fu Tang, Troy, NY (US); Thomas Parker, Albany, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 42 days.

(21) Appl. No.: 12/594,047

(22) PCT Filed: Mar. 26, 2008

(86) PCT No.: PCT/US2008/003907
§ 371 (c)(1),
(2), (4) Date: Apr. 19, 2010

(87) PCT Pub. No.: WO2008/123935
PCT Pub. Date: Oct. 16, 2008

(65) Prior Publication Data
US 2010/0209336 A1 Aug. 19, 2010

Related U.S. Application Data

(60) Provisional application No. 60/921,329, filed on Apr. 2, 2007.

(51) Int. Cl.
*C23C 16/00* (2006.01)
*B32B 7/00* (2006.01)
*B01J 23/00* (2006.01)
*B01J 23/44* (2006.01)

(52) U.S. Cl. ........ 427/250; 428/119; 502/325; 502/339; 502/353; 977/700; 427/587

(58) Field of Classification Search .................. 428/119; 427/250, 587
See application file for complete search history.

(56) References Cited

U.S. PATENT DOCUMENTS

| 6,270,719 B1 | 8/2001 | Fetcenko et al. |
| 6,726,892 B1 | 4/2004 | Au |
| 7,152,458 B2 | 12/2006 | Liu |
| 7,220,310 B2 * | 5/2007 | Wang et al. ............ 117/68 |
| 2006/0254501 A1 | 11/2006 | Wang et al. |

OTHER PUBLICATIONS

Alouach et al., "Texture orientation of glnacing angle deposited copper nanowire arrays," J. Vac. Sci. Technol. Jul./Aug. 2004, A 22(4):1379-1382.

Bauer et al., "Inclined Substrate Deposition by Evaporation of Magnesium Oxide for Coated Conductors," Mat. Res. Soc. Symp., 1000, 587:O2.2.1-O2.2.10.

Brewer et al., "Reflection high-energy electron diffraction experimental analysis of polycrystalline MgO films with grain size and orientation distributions," J. Appl. Phys., Jan. 1, 2003, 93(1):205-210.

(Continued)

*Primary Examiner* — Steven Bos
*Assistant Examiner* — Anthony J Zimmer
(74) *Attorney, Agent, or Firm* — Foley & Lardner LLP

(57) ABSTRACT

A nanostructure includes a plurality of metal nanoblades positioned with one edge on a substrate. Each of the plurality of metal nanoblades has a large surface area to mass ratio and a width smaller than a length. A method of storing hydrogen includes coating a plurality of magnesium nanoblades with a hydrogen storage catalyst and storing hydrogen by chemically forming magnesium hydride with the plurality of magnesium nanoblades.

4 Claims, 15 Drawing Sheets

OTHER PUBLICATIONS

Chao et al., "Quartz crystal microbalance sensor based on nanostructured IrO2," Journal of Sensors and Actuators, Jun. 27, 2006, vol. B 122, 95-100.

Chudzik et al., "Mechanism and Processing Dependence of Biaxial Texture Development in Magnesium Oxide Thin Films Grown by Inclined Substrate Deposition," IEEE Trans. Appl. Supercond., Mar. 2001, 11(1):3469-3472.

Dirks et al., "Columnar Microstructure in Vapor-Deposited Thin Films," Thin Solid Films, 1977, 47:219-233.

Gilmer et al., "Lattice Monte Carlo models of thin film deposition," Thin Solid Films, 2000, 365:189-200.

Hussain, S.B., "Orientation effects in thick CdS films," Thin Solid Films, 1974, 22:S5-S6.

Karpenko et al., "Growth anisotropy and self-shadowing: A model for the development of in-plane texture during polycrystalline thin-film growth," J. Appl. Phys., Aug. 1, 1997, 82(3):1397-1403.

Laermans et al., "Reflection Electron Diffraction Study of Oblique Textures in CdS Thin Films Produced by Electron Bombardment Evaporation," Thin Solid Films, 1973, 15:317-324.

Levin et al., "Growth habits and defects in ZnO nanowires grown on GaN/sapphire substrates," Appl. Phys. Lett., 2005, 87:103110-1 to 103110-3.

Liu et al., "Schwoebel-Ehrlich barrier: from two to three dimensions," Appl. Phys. Lett., May 6, 2002, 80(18):3295-3297.

Morrow et al., "Texture of Ru columns grown by oblique angle sputter deposition," J. Vac. Sci. Tech., Mar./Apr. 2006, A 24(2):235-345.

Robbie et al., "Sculptured thin films and glancing angle deposition: Growth mechanics and applications," J. Vac. Sci. Technol., May/Jun. 1997, A 15(3):1460-1465.

Sanders et al., "Metal/metal homoepitaxy on fcc(111) and fcc(001) surfaces: Deposition and scattering from small islands," J. Vac. Sci. Tech., Jul./Aug. 1992, A 10(4)1986-1992.

Sanders et al., "Metal/metal homo-epitaxy on fcc(001) surfaces: Is there transient mobility of adsorbed atoms?" Surface Science, 1991, 254:341-353.

Seryogin et al., "Catalytic hydride vapour phase epitaxy growth of GaN nanowires," Nanotechnology, 2006, 16:2342-2345.

Tait et al., "Modelling and characterization of columnar growth in evaporated films," Thin Solid Films, 1993, 226:196-201.

Tang et al., "AFM, SEM and in situ RHEED study of Cu texture evolution on amorphous carbon by oblique angle vapor deposition," Phys. Rev. B., 2005, 72:035430-1-035430-8.

Tang et al., "Surface pole figures by reflection high-energy electron diffraction," Appl. Phys. Lett., 2006, 89:241903-1-241903-3.

Tang et al., "Magnetic properties of Co nanocolumns fabricated by oblique-angle deposition," J. Appl. Phys., Apr. 1, 2003, 93(7):4194-4200.

Tang et al., "Magnetic properties of Co nanocolumns fabricated by oblique-angle deposition," Unusual Magnesium Crystalline Nanoblades Grown by Oblique Angle Vapor Deposition, Journal of Nanoscience and Nanotechnology, 2007, 7:3239-3244.

Thornton, John A., "Influence of substrate temperature and deposition rate on structure of thick sputtered Cu coatings," J. Vac. Sci. Technol., Jul./Aug. 1975, 12(4):830-835.

van der Drift, A., "Evolutionary Selection, A Principle Governing Growth Orientation in Vapour-Deposited Layers," Philips Res. Rep., 1967, 22:267-288.

Zaluska et al., "Structure, catalysis and atomic reactions on the nanoscale: a systematic approach to metal hydrides for hydrogen storage," Appl. Phys., 2001, A 72:157-165.

Zhao et al., "Designing Nanostructures by Glancing Angle Deposition," SPIE Proceedings, 2003, 5219:59-73.

* cited by examiner (a)

(b)

Calculated ■ (10$\bar{1}$0)[0001] biaxial texture

ULTRATHIN MAGNESIUM NANOBLADES

This application claims benefit of priority to U.S. Application Ser. No. 60/921,329, filed on Apr. 2, 2007 and incorporated herein by reference in its entirety.

This invention was made with Government support under contract number 0506738 awarded by the National Science Foundation. The Government has certain rights in the invention.

BACKGROUND

The present invention is directed to nanostructures in general and to metal nanoblades in particular. Oblique angle deposition has been demonstrated as an effective technique to produce three-dimensional nanostructures, such as nanosprings and nanorods; see for example Robbie et al., *J. Vac. Sci. Technol. A*, 15, 1460 (1997); Zhao et al., *SPIE Proceedings* 5219, 59 (2003). Because of the physical shadowing effect, the oblique incident vapor is preferentially deposited onto the highest surface features.

SUMMARY

A nanostructure comprises a plurality of metal nanoblades positioned with one edge on a substrate. Each of the plurality of metal nanoblades has a large surface area to mass ratio and a width smaller than a length.

In an alternative embodiment a method of storing hydrogen comprises (i) coating a plurality of magnesium nanoblades with a hydrogen storage catalyst; and (ii) storing hydrogen by chemically forming magnesium hydride with the plurality of magnesium nanoblades

Figure 13:
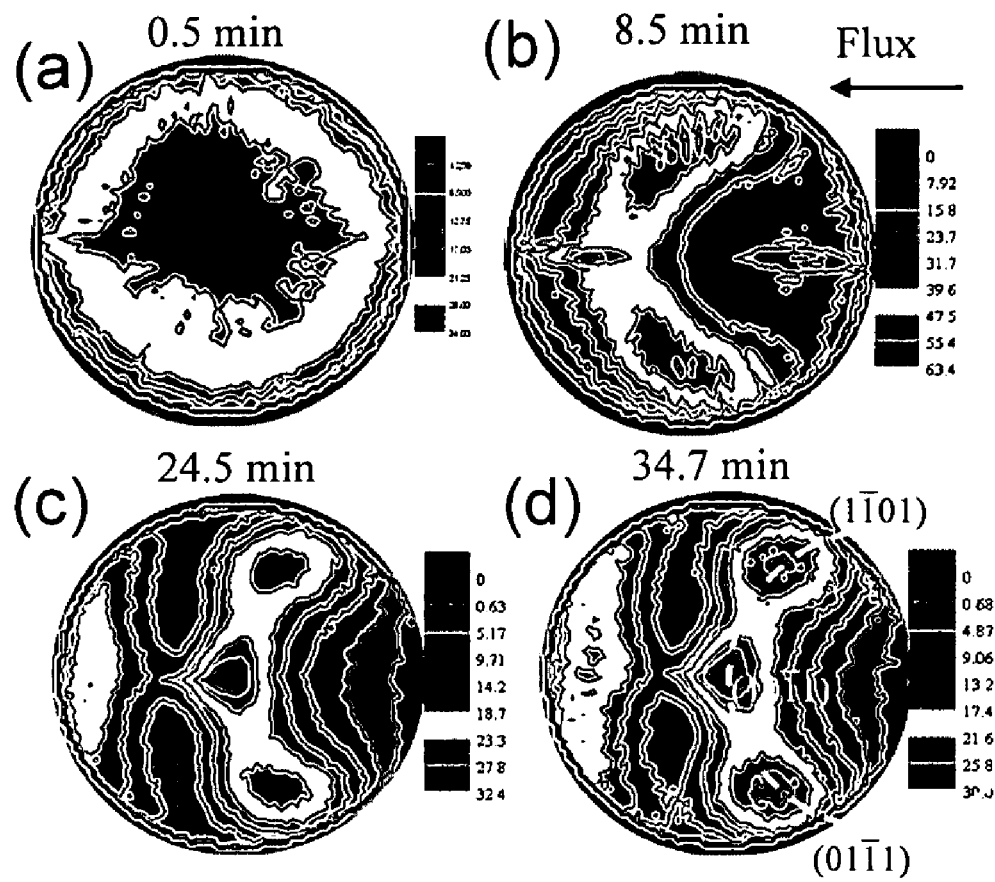

FIG. 13 shows normalized ($10\bar{1}1$) RHEED pole figures at deposition times of (a) 0.5 minutes (about 22 nm thick), (b) 8.5 minutes (about 365 nm thick), (c) 24.5 minutes (about 1.05 μm thick), and 34.7 minutes (about 1.49 μm thick). The positions of poles in the figures move towards the incident vapor flux as the film grows. The intensity of the azimuthal plot is around the white dashed circle which goes through ($1\bar{1}01$), ($10\bar{1}1$), and ($01\bar{1}1$) poles, as shown in (d). The center of circle is the geometrical position of the [0001] axis.

Figure 14:
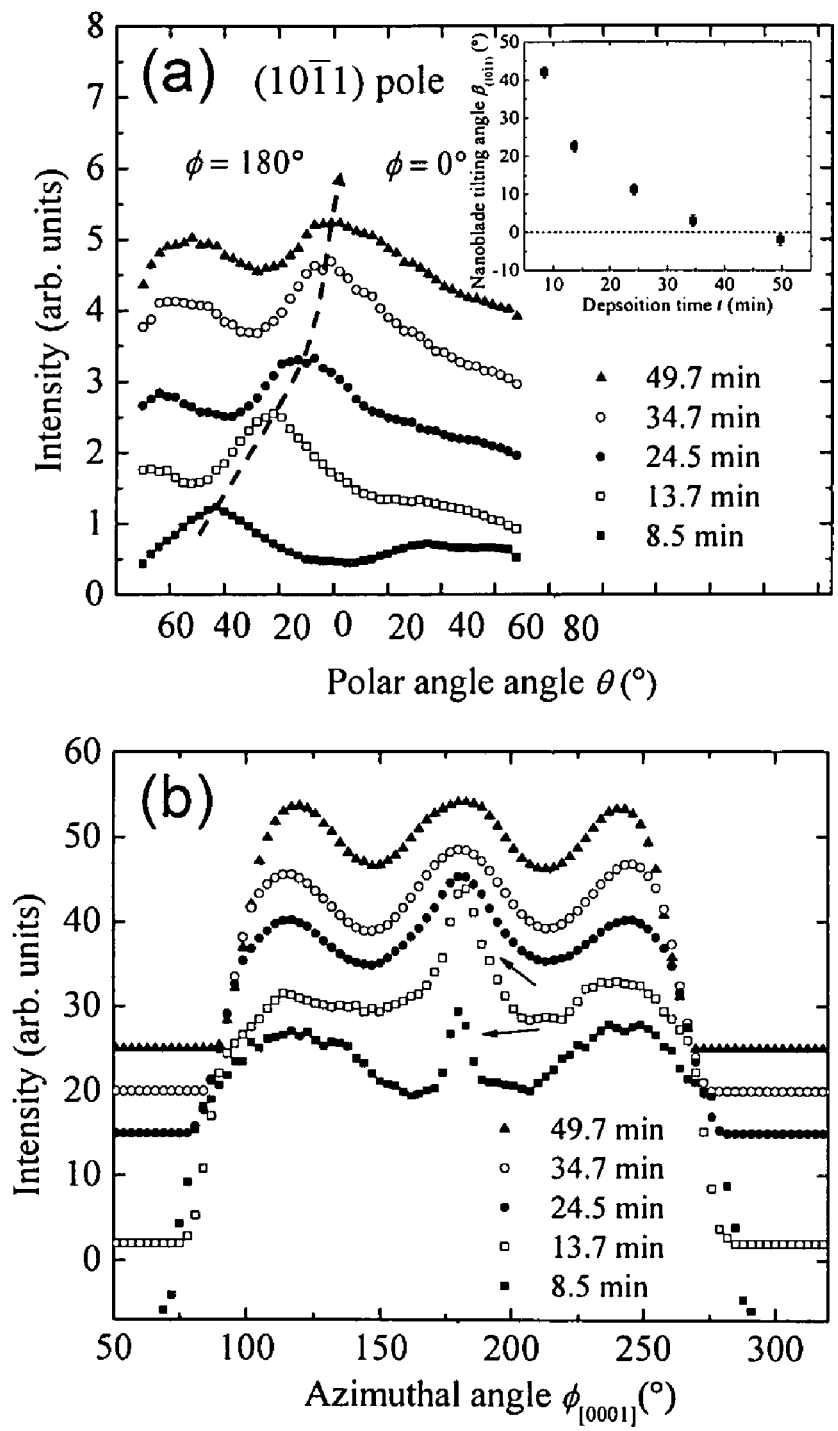

FIG. 14 shows (a) the ($10\bar{1}1$) polar intensity profiles at $\phi=0°$ (or 180°) of Mg nanoblades deposited for 8.5 minutes (about 365 nm thick), 13.7 minutes (about 589 nm thick), 24.5 minutes (about 1.05 μm thick), 34.7 minutes (about 1.49 μm thick), and 49.7 minutes (about 2.1 μm thick). The $\phi=0°$ means a direction towards the incident vapor flux and the $\phi=180°$ means a direction away from the incident vapor flux. The peak position with the maximum intensity moves towards the incident vapor flux as the film grows thicker. This trend is indicated by a dashed arrow, which corresponds to the movement of the ($10\bar{1}1$) pole positions. The inset of (a) is the plot of the texture axis tilting angle $\beta'_{(10\bar{1}1)}$ vs the deposition time t. (b) The intensity vs the azimuthal angle around the [0001] axis ($\phi_{[0001]}$) at different deposition times. Flat intensities on both sides of the curves represent the regions beyond the shadowing edges in RHEED patterns, which have zero intensity. The spikes at the center peaks labeled by arrows are due to the particles presented on the surface. The base lines of intensity profiles in (a) and (b) have been shifted for clarity.

Figure 15:
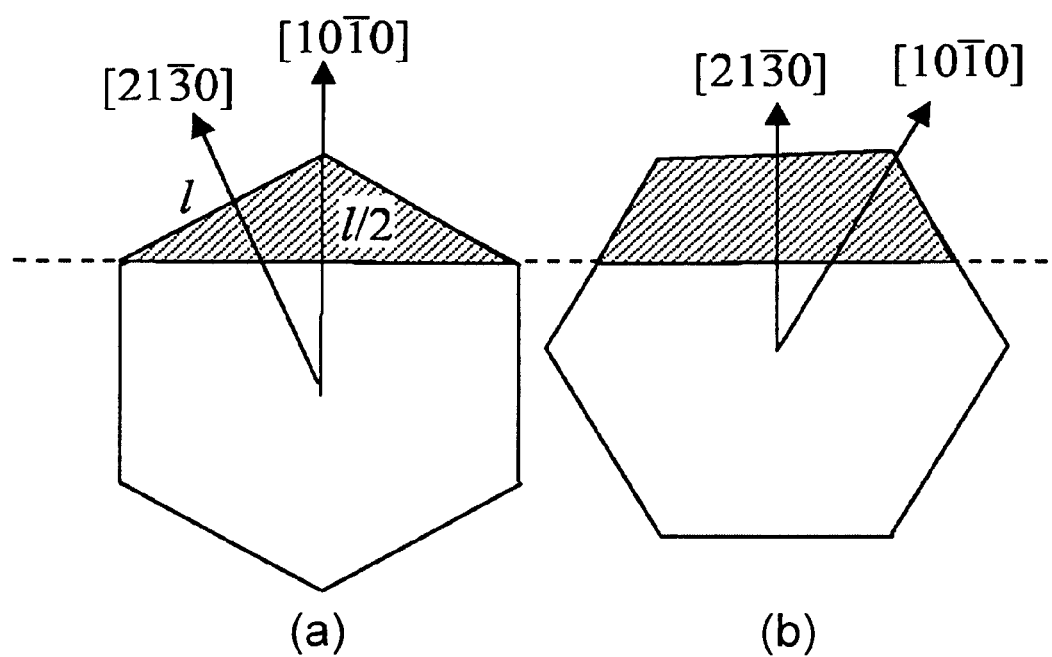

FIG. 15 illustrates schematics of views along the [0001] axis of the crystals with the azimuthal angle orientation when (a) the [$10\bar{1}0$] axis is along the vertical growth direction of a crystal and (b) the [$21\bar{3}0$] axis is along the upward growth direction of a crystal. The two shaded regions above the dashed horizontal line are used as examples to calculate the flux capture cross sections in the two different azimuthal angle alignments. The side length of a crystal is l. In the final film, the [0001] axis is tilted away from the substrate normal under oblique angle deposition.

DETAILED DESCRIPTION

All references cited herein are hereby incorporated by reference in their entirety.

Introduction

Oblique angle deposition ("OAD") has been demonstrated to be an effective technique to produce three-dimensional nanostructures, such as nanosprings and nanorods; see for example Robbie et al., *J. Vac. Sci. Technol. A*, 15, 1460 (1997); Zhao et al., *SPIE Proceeding*, 5219, 59 (2003). In this technique, the vapor flux is incident at an oblique angle α with respect to the substrate normal while the substrate is stationary or rotating around the surface normal. As a result of the physical shadowing effect, the oblique incident vapor is preferentially deposited onto the highest surface features. This preferential growth dynamic gives rise to the formation of well-separated nanostructures. The dimension of these nanostructures generally ranges from tens to hundreds of nanometers, depending on the deposition material, deposition rate and the substrate temperature. For materials with high diffusivity, the initial nucleation density is low and this can lead to more isolated structures. It is generally believed that in this case the dimensions of the deposited structures are larger. In addition to the shadowing effect and diffusion, the intrinsic microstructure of the deposited material also affects the formation of the nanostructures.

Figure 1:
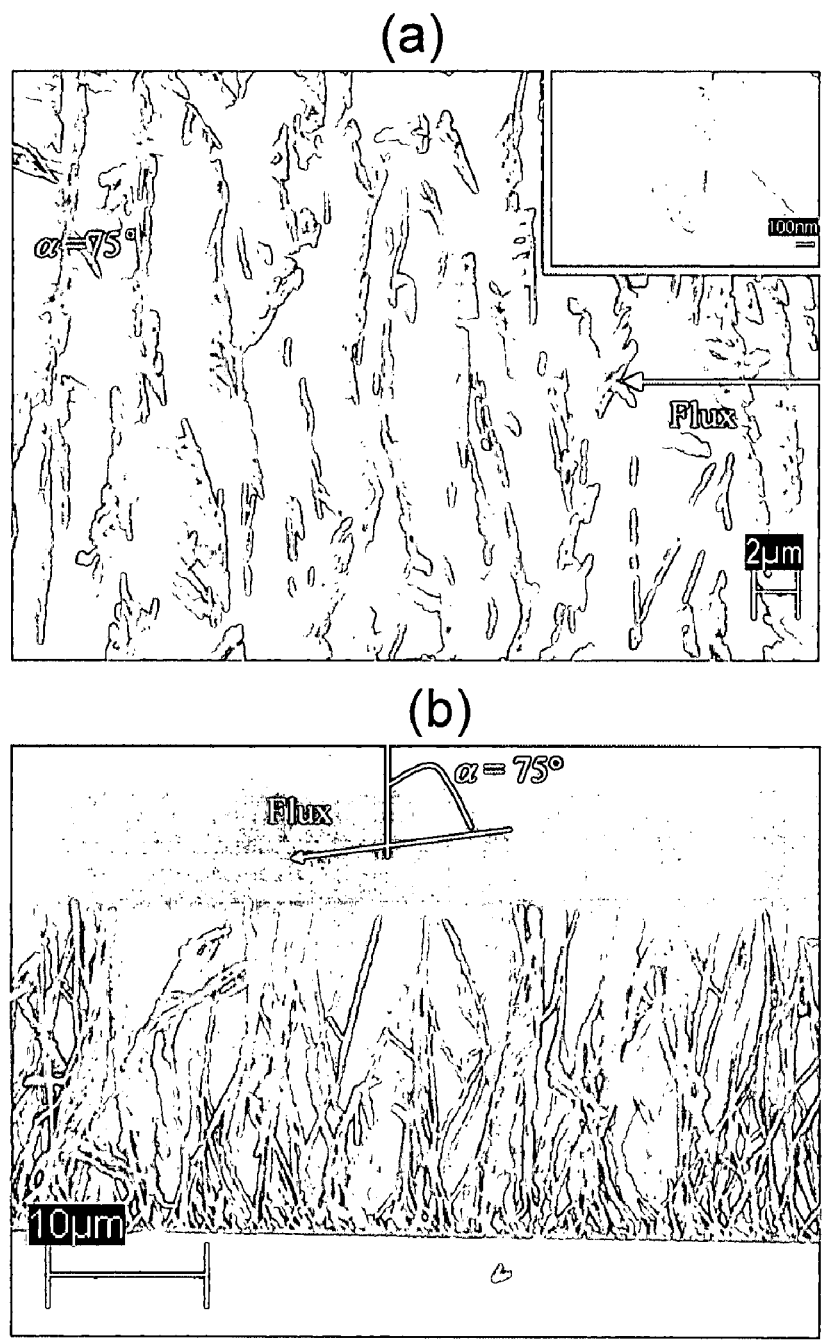
FIG. 1 shows SEM images of (a) a planar view of Mg nanoblades (b) a side view of Mg nanoblades.
Figure 2:
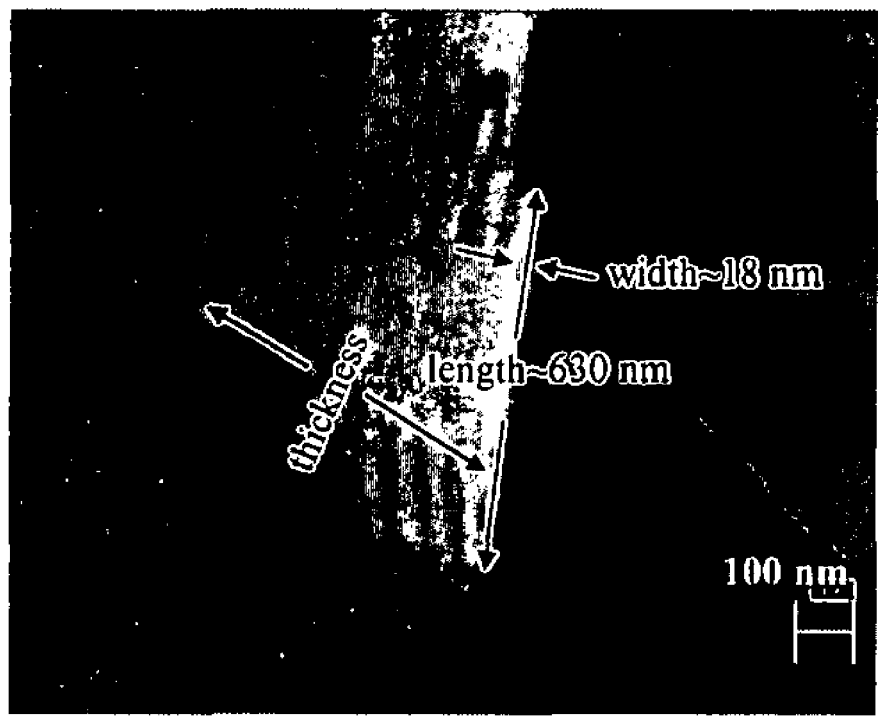
FIG. 2 shows a SEM top view image of one of the Mg nanoblades grown by oblique angle vapor deposition at a 75° incident angle with respect to substrate normal.
Figure 3:
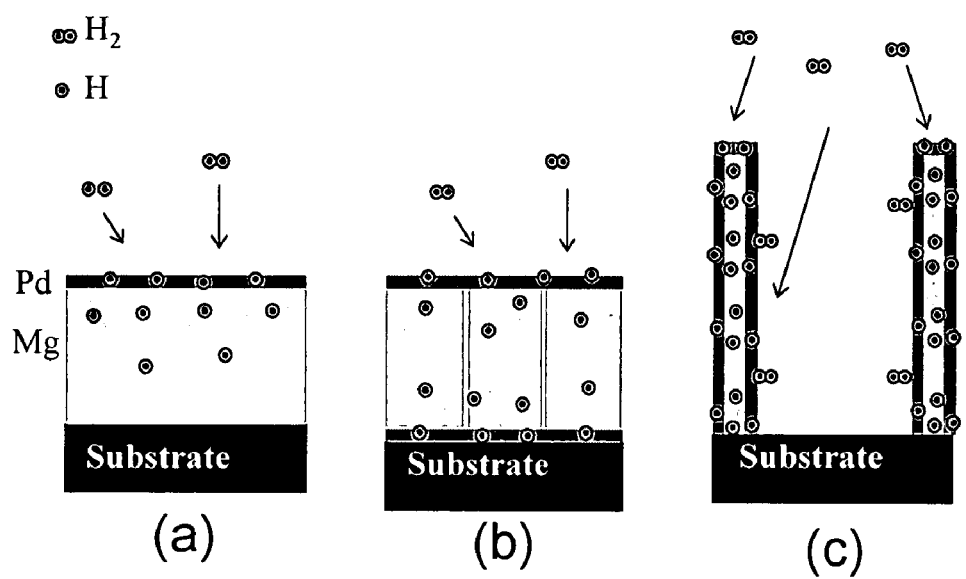
FIG. 3 provides schematics of hydrogenation: (a) Pd on a continuous Mg film, (b) Pd on columnar Mg film/Pd. The surface area to mass ratio for (a) and (b) is in the order of $10^{-2}$ m$^2$/g. (c) Atomic layer deposition of Pd on Mg nanoblades with surface area to mass ratio in the order of 60 m$^2$/g.

In one embodiment of the present invention, the growth of magnesium (Mg) nanoblades by the oblique angle deposition with no substrate rotation was observed. These nanoblades stand nearly vertically, thus deviating from the well-known tangent and cosine rules for columnar structures grown by oblique angle deposition, as shown in FIG. 1; see for example Dirks et al., *Thin Solid Films* 47, 219 (1997); Tait et al., *Thin Solid Films*, 226, 196 (1993). FIG. 2 presents a SEM top view image of one of the Mg nanoblades grown by OAD at an 75° incident angle. The width of the Mg nanoblades along the incident vapor direction can be between about 15 and about 80 nm; for example between about 15 to about 30 nm, while the dimension perpendicular to the incident vapor direction, or length, can be as much as a few hundred nm, such as about 200 nm to about 2000 nm. The thickness, or vertical height, is a function of the material, and can be between about 10 μm to about 500 mm. The width is a function of the angle of vapor flux during deposition, and can be about between 15 nm to about 60 nm. The formation of these extremely anisotropic structures with nanometer scale features shows that the growth of highly diffusive Mg deviates significantly from past experimental results and theoretical predictions. In addition to the anisotropic blade morphology, a biaxial (II-O) texture can be observed using in situ reflection high energy electron diffraction (RHEED). Exemplary illustrations of such texture are provided in for example Bauer, Fiber Texture, *The Ninth Nat. Vacuum Symp. Am. Vac. Soc.*, edited by H. George and Bancroft, Macmillan, NY (1963); Brewer et al., *J. Appl. Phys.* 93, 205 (2003). The surface area to mass ratio can reach between about 40 $m^2/g$ to about 60 $m^2/g$, such as 52 $m^2/g$, using an average width of about 15 to about 30 nm, such as about 22 nm. This value is about two orders of magnitude higher than that of ball-milled Mg powders that contain nanocrystallites; see for example Zaluska et al., *Appl. Phys. A* 72, 157 (2001). The nanoblades have potential applications in many areas due to this very high ratio. For example, the nanoblades could be used as a metal hydride for hydrogen storage or as a photocathode material, as illustrated in FIG. 3.

Unlike three-dimensional springs and rods, nanoblades are extremely thin, with very large surface areas. The large surface area feature makes nanoblades particularly appealing for energy storage applications, particularly hydrogen storage. In order to store hydrogen, a large surface area is desired to provide room for the material to expand as more hydrogen atoms are stored. The vast surface area of each nanoblade, coupled with the large spaces between each blade, can make nanoblades desirable for this application.

While OAD is the preferred deposition method, other suitable deposition methods may also be used. Although Mg is preferred, nanoblades of other metals or alloys can also be formed.

NON-LIMITING EXAMPLES

Magnesium Crystalline Nanoblades Formed by Oblique Angle Vapor Deposition 1.1 Experimental Details An ultra high vacuum (UHV) thermal evaporation system was used to deposit Mg nanoblades. The Mg pellets (purity 99.95%) were placed in an aluminum oxide crucible and heated resistively to the desired temperature of about 653 K for evaporation. To study the effect of the vapor incidence angle, the deposition was performed simultaneously on four substrates mounted on a multi-angle sample holder with α=0°, 30°, 59°, and 75°. The angle α is between the incident flux and the substrate surface normal. The substrates were p-type Si(100) with a thin layer of native oxide residing at the surface. The distance between evaporation source and the substrate holder was approximately 10 cm. The base pressure of the vacuum chamber was about $3 \times 10^{-10}$ Torr. The Mg source was thoroughly degassed and evaporated for about 25 minutes prior to the deposition. During the deposition the pressure rose to about $1.2 \times 10^{-8}$ Torr. The evaporation rate was maintained between 0.9 and 1.1 nm/s as indicated by a quartz crystal monitor (QCM). A K type thermocouple was attached to the substrate holder and showed a temperature increased from 303 K to 310 K during the deposition. The total deposition time was 90 minutes. The crystalline structure on the surface of the deposited films was characterized in situ by RHEED. The microstructure of the Mg films was studied ex situ by field emission scanning electron microscopy (SEM) and transmission electron microscopy (TEM).

1.2 Results and Data Analysis

SEM and TEM Images of the Nanoblades

FIGS. 4(a) to (d) and the insets provide SEM top view images of the deposited Mg films at different vapor incident angles. At normal vapor incidence, the film was continuous and comprised polygon shaped crystals. The crystal sizes were on the order of a few micrometers. The measured angle between the edges of a crystal from the high-resolution SEM image shown in the top right inset of FIG. 4(a) was about 125°. This suggests that these large crystals were the result of coalescence of multiple HCP (0001) oriented crystals. Taking the ratio of the substrate temperature to melting temperature of Mg yielded a homologous temperature of about 0.34 ($T_h=T_s/T_m=310$ K/923 K). This value of about 0.34 indicates that the growth of Mg should be in Zone II regime ($0.3<T_h<0.5$), according to the structural zone model of deposited films; see for example Thornton, *J. Vac. Sci. Technol.* 12, 830 (1975); Barna et al., Growth Mechanisms of Polycrystalline Thin Films, *Science and Technology of Thin Films*, edited by Matacotta and Ottaviani, World Scientific (1995). The growth in Zone II regime implies a high atomic mobility, which is consistent with the large crystals observed in FIG. 4(a). At a vapor incident angle of 30°, the film started to form a stripe shaped structure perpendicular to the vapor incident direction (see FIG. 4(b)). The width of the stripe along the vapor incident direction was about 250 to about 300 nm. As the deposition angle increased, the width of the stripes along a vapor incident direction dramatically decreased, forming thin nanoblades. In one embodiment, at the vapor incident angle of 59°, the width of the nanoblades along the vapor incident direction varied from about 30 to about 150 nm. At a vapor incident angle of 75°, the nanoblades became ultrathin with a width of about 15 to about 30 nm. The dimension perpendicular to the vapor incident direction, or length, was on the order of a few hundred nm. A typical nanoblade is shown in the top right inset of FIG. 4(d), wherein the surface steps along the width of the nanoblades can be seen.

Figure 4:
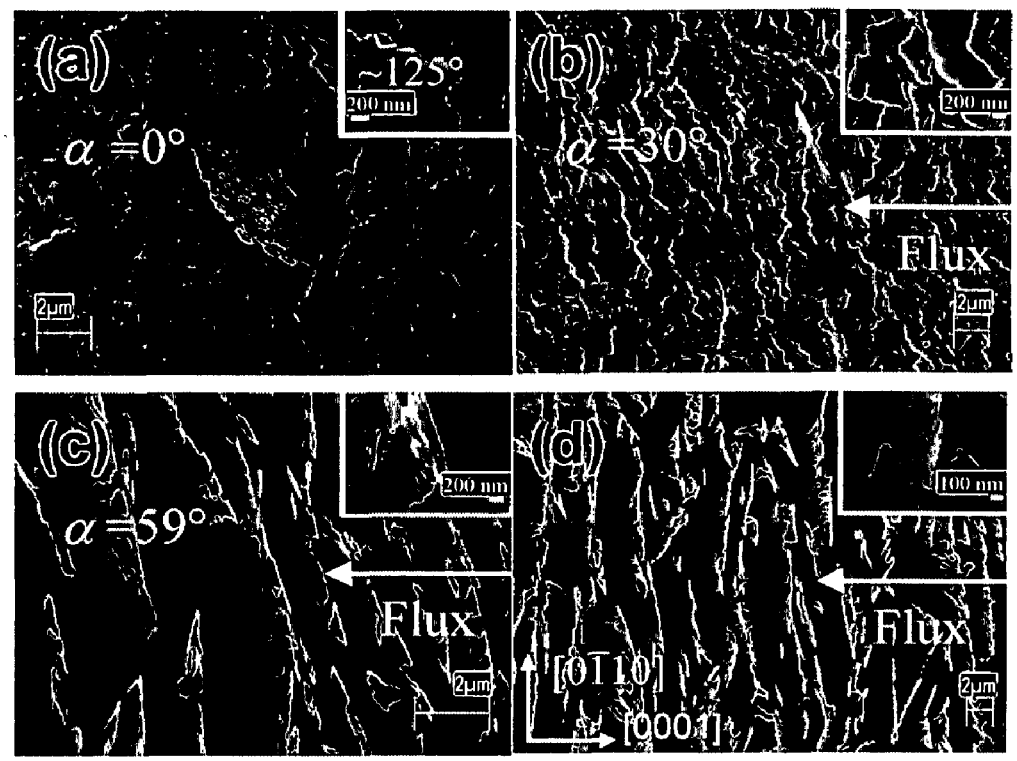
FIG. 4 shows top view SEM images of the Mg films deposited at vapor incident angles α of (a) 0°, (b) 30°, (c) 59°, and (d) 75°. Alpha (α) is the vapor incident angle measured from the substrate normal. The inset in each figure shows a higher magnification view. The crystal axes, obtained from texture analysis, are indicated as white arrows in (d) and its inset. The scale bar in the insets is 200 nm except that in (d) is 100 nm.
Figure 5:
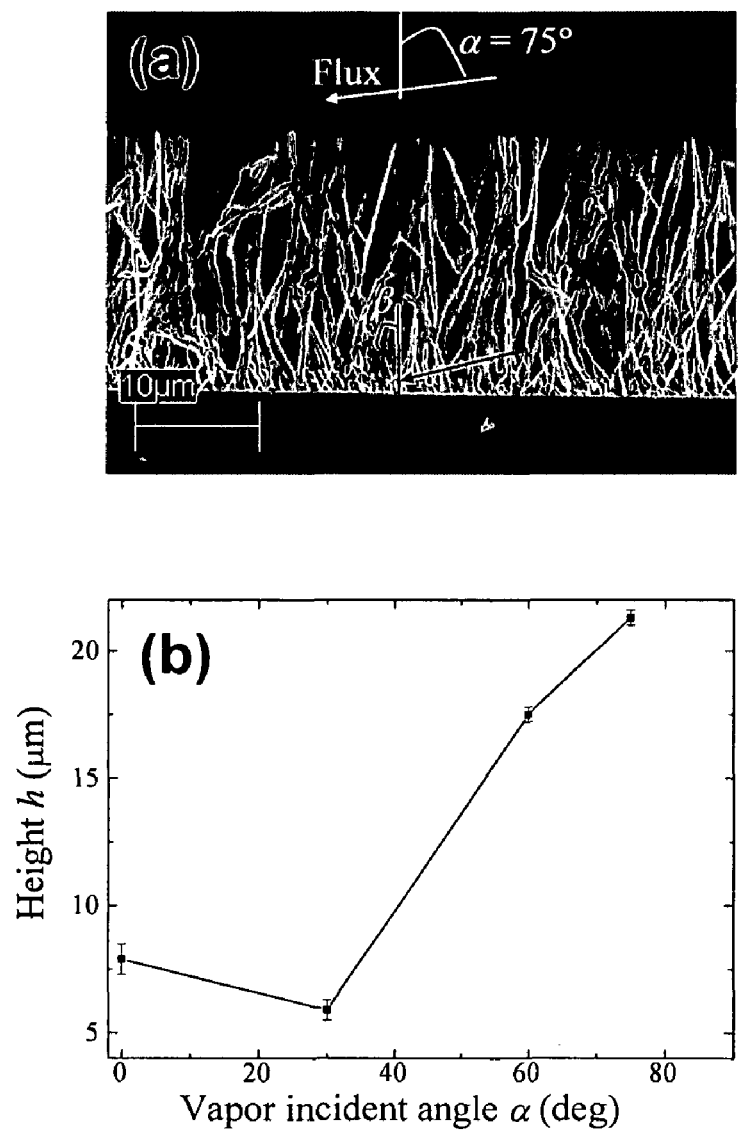
FIG. 5 presents (a) cross sectional SEM image of the Mg nanoblades deposited at a vapor incident angle α of 75°. The black arrow indicates the tilted nanoblades at the beginning of the growth. α and β are the vapor incident angle and the nanoblade tilting angle measured from the substrate normal, respectively. (b) A plot of the vertical heights of the nanoblade films as a function of the vapor incident angle.

FIG. 5(a) shows the cross-sectional SEM image of the Mg nanoblade film deposited at 75°. The nanoblades were almost vertical and ran through the entire thickness of the film except near the substrate. In the early stage of growth (less than about 1 μm), some nanoblades tilted away from the flux. The tilting angle of nanoblades was defined as β, which was measured from the substrate normal as indicated in FIG. 5(a). This tilting and vertical growth of the nanoblades deviated from the tangent and cosine rules that related β to the incident flux angle α during oblique angle deposition. An illustration of the height of the film with respect to the vapor incident angle is provided in FIG. 5(b). The height along the substrate normal varied from a few μm to about 21 μm as the incident flux angle increased from 0° to 75°. The films deposited at the two largest incident vapor angles were much taller than the film deposited at normal vapor incidence, even though they received less flux. It has been observed that films such as Co deposited at normal vapor incidence are thicker than films deposited at oblique angles; see for example Tang et al., *J. Appl. Phys.* 93, 4194 (2003). The disagreement came from the vertically oriented nanoblades versus the conventional slanted nanorods grown by oblique angle deposition. The unexpected height of the nanoblades was accompanied by the extremely porous nature of the film. The nanoblades can be separated from one another by about 0.5 to 3 μm, such as about 1 to about 2 μm, as shown in FIGS. 4(c) and (d).

Figure 6:
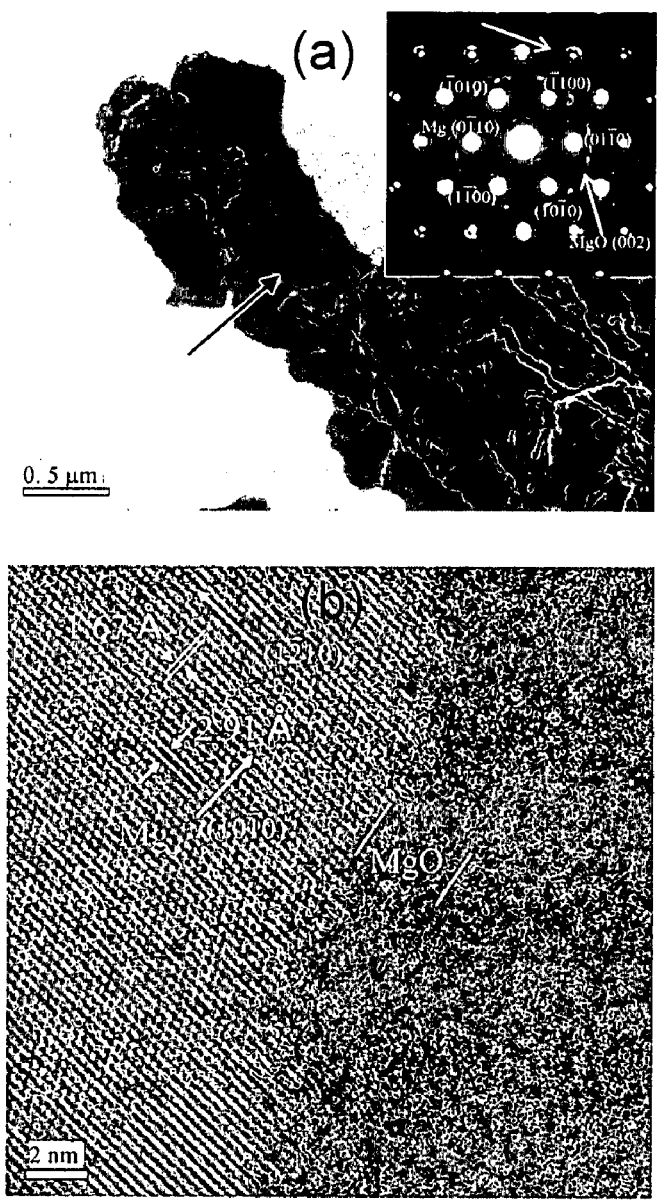
FIG. 6 shows (a) TEM bright field image of the Mg nanoblades deposited at a vapor incident angle of 75°. The black arrow indicates the particular nanoblade that was selected for a detailed analysis. The inset of (a) shows one of the selective area electron diffraction (SAED) patterns of the nanoblade. In addition to the diffraction spots from crystalline Mg there is ring structure from MgO. (b) The lattice fringe image near the edge of the nanoblade. The interplanar distances for the ($1\bar{2}10$) plane and ($10\bar{1}0$) plan are measured to be 1.67 Å and 2.91 Å, respectively. About 2 to 4 nm thick oxidation region (MgO) adjacent to crystalline Mg was seen after the sample was exposed in the air.

The single crystal nature of a single Mg nanoblade was investigated using TEM. FIG. 6(a) shows the bright field TEM image of the Mg nanoblades that were deposited at an incident vapor angle of about 75°. The black arrow indicates the nanoblade selected for a detailed analysis. One representative selective area electron diffraction (SAED) pattern along the (0001) zone axis is shown in the upper right inset of FIG. 6(a). In addition to the spot pattern, two weak diffraction rings from polycrystalline MgO are labeled by white arrows in the diffraction pattern. The oxidation of the sample occurred after exposure to air. FIG. 6(b) is a high resolution transmission electron microscopy (HRTEM) image taken near an edge of the nanoblades. The Mg lattice fringe can be seen in the image. The measured distances between lattice fringes in two orthogonal directions were about 2.91 Å and about 1.67 Å. These two values were close to the (1010) and (1210) interplanar distances of the Mg hexagonal close-packed (HCP) structure, which were 2.78 Å and 1.61 Å, respectively. Additionally, FIG. 6(b) shows that an oxidation layer with a thickness of about 2 to about 4 nm is adjacent to the Mg crystal, and the interface between Mg crystal and oxide is diffusive.

RHEED Patterns and Texture Analyses

Figure 7:
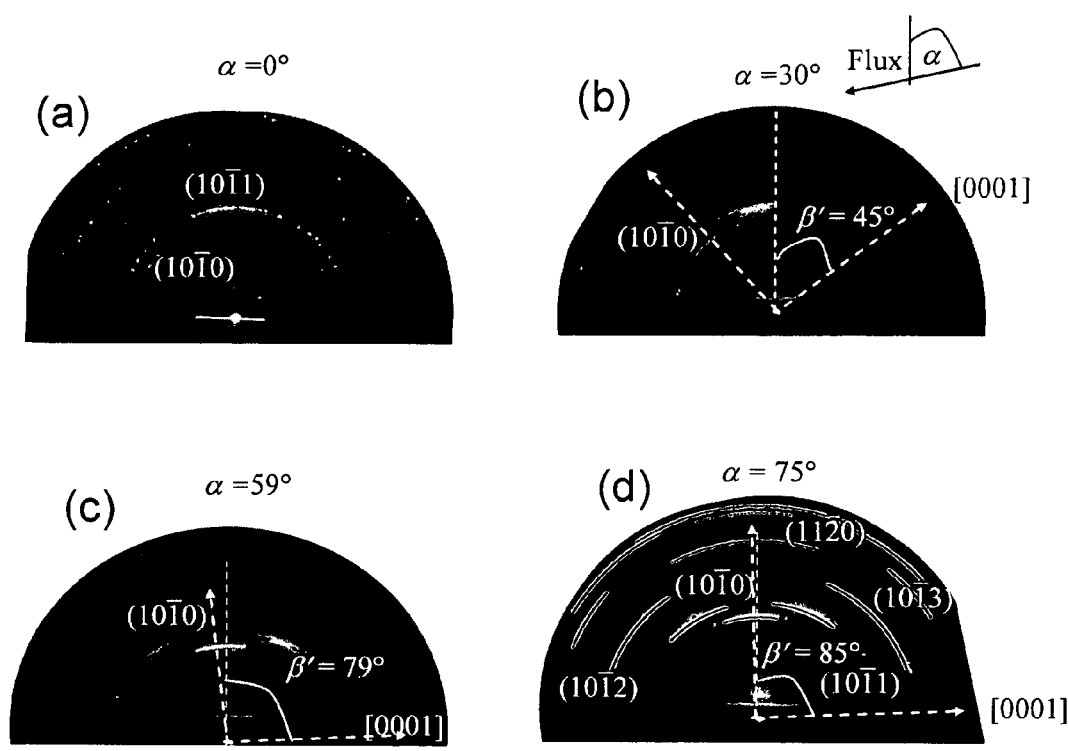
FIG. 7 presents in situ RHEED images of the Mg nanoblade films deposited at vapor incident angles of (a) 0°, (b) 30°, (c) 59°, (d) 75°. The simulated diffraction pattern for a ($10\bar{1}0$) [0001] biaxial (II-O) texture was superimposed on the top of the measured diffraction pattern in (d). α and β' are the vapor incident and texture tilting angles measured from the substrate normal, respectively.

In addition to the ex situ characterization of the Mg films, an in situ RHEED was used to study their crystalline orientations. As shown in the SEM top view images, the nanoblades were well aligned, with the wider sides approximately perpendicular to the vapor flux direction and the thin sides parallel to the vapor flux direction. This suggests that the Mg nanoblades had two preferred crystalline orientations, (i.e., a biaxial, or II-O texture). The biaxial texture has been often observed in the films grown by oblique angle deposition; see for example, Alouach et al., *J. Vac. Sci. Technol. A* 22, 1379 (2004); Tang et al., *Phys. Rev. B.* 72, 035430 (2005); Morrow et al., *J. Vac. Sci. Tech. A* 24, 235 (2006). FIGS. 7(a) to (d) provide in situ RHEED images of the Mg films deposited at different angles. The diffraction patterns of films grown at oblique angles were composed of distributed arcs that indicated a well-developed texture. In one embodiment, the diffraction pattern for α=75° was examined, as shown in FIG. 7(d). The ratios between the various radii of the diffraction arcs in FIG. 7(d) are 1:1.13:1.46:1.72:1.88, indicating that the diffraction arcs were from the (10$\bar{1}$0), (10$\bar{1}$1), (10$\bar{1}$2), (11$\bar{2}$0), and (10$\bar{1}$3) planes. The lattice constants a and c measured from the diffraction pattern were 3.18±0.10 Å and 5.20±0.17 Å. Both of the measured values were close to those of the Mg crystal, which were 3.21 and 5.21 Å, respectively. Through the analyses of the angles between different diffraction arcs, the (10$\bar{1}$0) [0001] biaxial texture was found to form in the Mg film. In this biaxial texture, the preferred orientations were the surface normal of the (10$\bar{1}$0) plane and the [0001] axis. The simulated diffraction pattern for this biaxial texture was superimposed on the top of the diffraction pattern in FIG. 7(d). The (10$\bar{1}$0) texture axis, namely the [21$\bar{3}$0] axis, is almost normal to the substrate, while the [0001] axis points along the vapor flux direction with an angle β=85°. Beta prime (β') is the tilting angle of the [0001] axis as measured from the substrate normal. This β' angle (85°) suggests that the side faces of the nanoblades perpendicular to the flux direction are (0001) crystalline planes. Orthogonal to the [0001] and [2$\bar{1}$$\bar{3}$0] axes is the [01$\bar{1}$0] axis. These three crystal axes can serve as a spatial reference. These axes are also indicated by the arrows shown in FIG. 4(d). The β' decreased to 79° and 45° as the incident flux angle α decreased from about 59° to about 30°, respectively. At the normal vapor incidence, the diffraction patterns in FIG. 7(a) showed a weak vertical (10$\bar{1}$1) fiber texture and an absence of {0001} planes parallel to the substrate.

Figure 8:
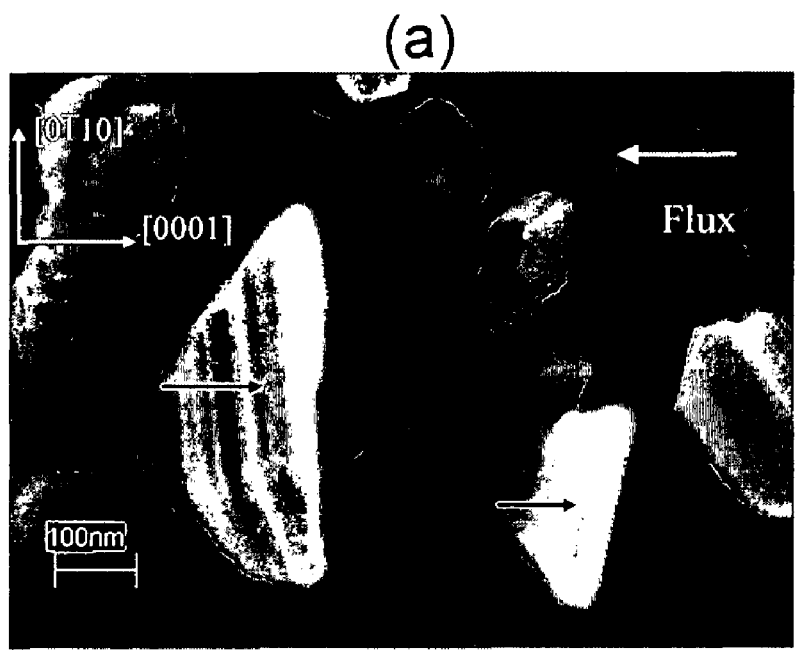
FIG. 8 shows (a) top view SEM image of a thin Mg nanoblade film deposited at a vapor incident angle of 75° with a height of about 630 nm. Black arrows indicate surface steps formed during the growth. (b) A schematic of the growth modality for crystal growth with high surface diffusion. Diffusions along the [$0\bar{1}10$] and [$2\bar{1}\bar{3}0$] directions are indicated by the movements of the atoms. The growth rate V along the [$2\bar{1}\bar{3}0$] direction can be divided into the vertical and parallel components, V⊥ and V$_\parallel$, respectively. α, β, and β' are the vapor incident angle, nanoblade tilting angle, and texture tilting angle measured from the substrate normal, respectively.
Figure 8:
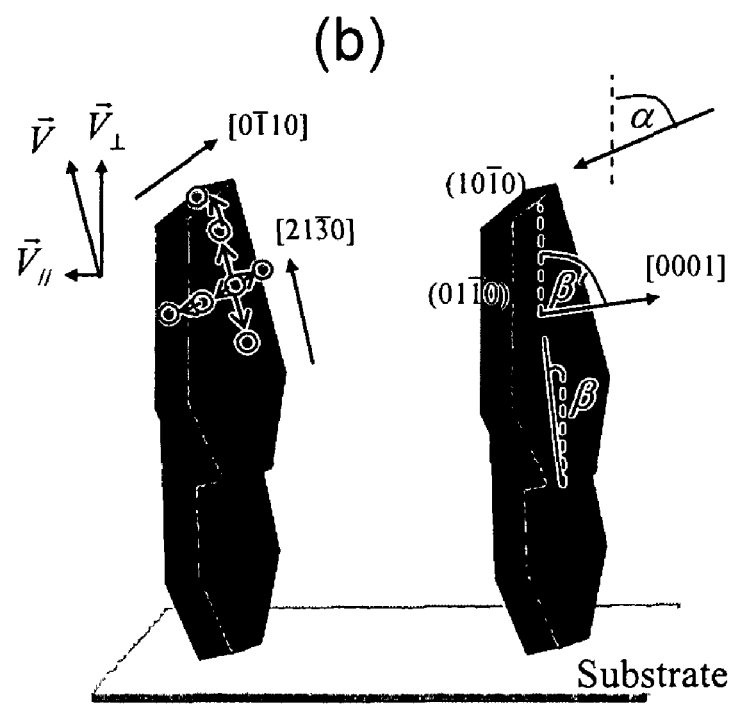

The RHEED analysis indicates that the side surface of the nanoblades that faced the flux was an (0001) plane. This plane is the most compact crystalline plane in the hexagonal close packed (HCP) structure, which has the lowest surface energy. Since the nanoblades stand vertically, the (0001) surface faces the vapor flux, and consequently receives the majority of the flux. The formation of these long and thin nanoblades implies that the atoms deposited on the (0001) surface diffuse readily to the edges of this face and are transported to the adjacent surfaces, which are parallel to the vapor flux; see for example Gilmer et al., *Thin Solid Films* 365, 189 (1999); Liu et al., *Appl. Phys. Lett.* 80, 3295 (2002). The adjacent surfaces are higher surface energy planes such as {10$\bar{1}$0} planes, according to the equilibrium crystal structure; see for example Bauer, Growth of Oriented Films on Amorphous Surfaces in Single-Crystal Films, edited by Francombe and Sato, Macmillan, NY (1964). Additionally, the SEM image in FIG. 4(d) shows the step structure on the crystal surface. These steps are more clearly seen in the initial growth of the crystal. FIG. 8(a) shows a top view SEM image of a thick film of about 630 nm, deposited at a vapor incident angle of 75°. In this image, a series of steps along the [0$\bar{1}$10] direction are visible on the surface of the nanoblade, indicated by the black arrows. The step structure could indicate a high density of planer defects such as stacking faults parallel to the (0001) plane; see for example Seryogin et al., *Nanotechnology* 16, 2342 (2005); Levin et al., *Appl. Phys. Lett.* 87, 103110 (2005).

Thickness of the Nanoblades Along the Incident Vapor Flux Direction

Based on the experimental observations, in FIG. 8(b) a schematic of the proposed growth model is provided. After atoms land on the (0001) surface, they diffuse isotropically. This leads to the growth of the crystal along the [0$\bar{1}$10] and [2$\bar{1}$$\bar{3}$0] directions. The growth along the [01$\bar{1}$0] direction results in the disproportional width of the nanoblade in the direction perpendicular to the vapor flux. The growth along the [2$\bar{1}$$\bar{3}$0] direction contributes to the vertical growth of the nanoblades. As the atoms are transported to the adjacent {10$\bar{1}$0} surfaces the diffusion would be slower compared to that on the (0001) plane. This lower diffusion will lead to a reduced thickness of the nanoblades. However, the difference in the diffusion on these planes is usually small. Surface defects such as steps observed in the morphology of the nanoblades may be an important factor in accounting for the formation of the ultrathin nanoblades. Since the {10$\bar{1}$0} faces have a higher surface energy, the transported atoms will prefer to stay on these planes as shown in FIG. 8(b). They may not have sufficient thermal energy to move over the nearby step onto the (0001) plane. The width of the step plateau along the [0001] axis (i.e., the vapor flux direction) can determine the width of the nanoblade in the flux direction. A systematic molecular dynamics (MD) simulation can be helpful to understand the detailed mechanism of the surface diffusion and the formation of the surface steps.

Tilting Angles of the Texture Axis and Nanoblades

Without wishing to be bound by a particular theory, the relationship between the tilting angle of the (0001) plane and the vapor incident angle can be understood using the van der Drift theory for highly diffusive surfaces; see for example van der Drift, *Philips res. Rep.* 22, 267 (1967). Based on this theory, the nanoblades with the highest vertical growth rate can survive. For the nanoblade, the vertical growth rate is a result of the diffusion along the [2$\bar{1}$$\bar{3}$0] direction. The total material received by the crystal is ~cos(α−β'), so that the growth rate V along the [2$\bar{1}$$\bar{3}$0] direction is also ~cos(α−β'). The vertical component $V_\perp$ of the growth is ~cos(α−β')sin β'. $V_\perp$ is maximized when β'=45°+½α. Using the values of α=30°, 59°, and 75°, β' is calculated to be 60°, 74.5° and 82.5°, respectively. It was observed that at high vapor incident angles α, (i.e., 59°, and 75°), the predicted β' values 74.5° and 82.5° were close to the experimental β' values of 79° and 85°. However, for α=30° the experimental β' value was 45°, which was much smaller than the predicted value of 60°. This can be due to the reduced influence of the shadowing at smaller α angles. As the shadowing effect was weakened the crystals with smaller tilting angles were not suppressed. Since the nanoblades grow slowly along the [0001] axis, the growth along the [2$\bar{1}$$\bar{3}$0] axis caused the blades to tilt away from the flux at an angle β=90−β', where β is measured from the substrate normal. The tall nanoblades that survived have large β values, indicating that those nanoblades stood nearly vertically. However, at the early stages of growth, the nanoblades with a large tilting angle β (i.e., small β') can also exist, as shown in the cross sectional SEM image in FIG. 5(a). Markus Bauer et al. have observed that under oblique angle e-beam deposition, the MgO rods tilted slightly away from the vapor flux; they argued that this abnormal tilting angle was due to a directional diffusion originated from the momentum of the incident vapor atoms; see for example Bauer et al., *Mat. Res. Soc. Symp.* 587, O2.2.1 (2000). In one embodiment, for the 75° incident, Mg flux was close to a normal incidence on the (0001) surface of the nanoblades. In addition, the kinetic energy of the Mg vapor atoms was very small at about 0.056 eV, so that directional diffusion should be negligible; see for example Sanders et al., *Surface Science* 254, 341 (1991); Sanders et al., *J. Vac. Sci., Tech. A* 10, 1986 (1992).

In some embodiments, palladium (Pd) can be coated on the nanoblades as a nanocatalyst in situ by vapor evaporation or ex situ by atomic layer deposition to lower the hydrogen adsorption/desorption temperatures. Any other liquid or vapor phase deposition methods may also be used. Through this approach a new class of materials for reversible absorption and desorption of hydrogen at moderate temperature and pressure with extremely high storage capacity can be developed. Other catalysis suitable for hydrogen storage, such as vanadium, platinum, niobium, or cobalt can also be used. Other applications, such as electron emitters, photoemission electron cathodes, can also be fabricated with this class of material.

In one embodiment, the Mg nanoblades, formed by OAD (see FIG. 2) had a surface area to mass ratio of about 60 m²/g. This estimated value came from these parameters: length of the nanoblade, about 20 μm, volume of the nanoblade, 630 nm×18 nm×20 μm=2.26×10$^{-13}$ cm³, density: 1.738 g/cm³, and mass: 3.928×10$^{-13}$ g. These numbers gave a surface area of about 630 nm×20 μm×2=2.5×10$^{-11}$ m². Ratio of surface area/mass=63 m²/g. Note that in some other embodiments, this ratio can be 45 m²/g or higher, and can range from about 50 m²/g to about 70 m²/g. This surface area to mass ratio was approximately decided by the width (about 18 nm) of the nanoblade. This value was at least about three orders of magnitude higher than that of a continuous Mg film made by normal vapor incident deposition or about two orders of magnitude higher than that of ball-milled Mg powders that contain nanosize grains. In addition, since the Mg nanoblades have width of less than 60 nm, such as about 20 nm, hydrogen dissociated by nanocatalyst Pd can diffuse through the whole thickness of the nanoblades to form Mg hydride, and the time required in hydrogenation and de-hydrogenation processes in these nanoblades can be short (see FIG. 3). The Mg nanoblade theoretically can take up to 7.6 wt. % hydrogen. The gaps between vertically standing, isolated nanoblades can accommodate between about 20% to about 40%, such as 30%, volume expansion between Mg and magnesium hydride during cycling. This may extend durability and cycle lifetime. Atomic Layer Deposition (ALD) is a desirable technique for a conformal uniform coating of a material because it is a precisely controlled deposition technique for metals, as shown in FIG. 3. In one embodiment, ex situ ALD is used to coat the Mg nanoblades conformally with Pd. Pd can be deposited by this method on metal and oxidized metal surfaces such as on air-exposed Ta and Si without the use of plasma.

2. RHEED Surface Pole Figure Study 2.1 Experimental Details

An ultrahigh vacuum (UHV) thermal evaporation system was used to deposit a Mg film. The substrates were p-type Si(100) with a thin layer of native oxide residing at the surface. The vapor incident angle $\alpha$ with respect to the substrate normal was about 75°. The distance between the evaporation source and the substrate holder was approximately 10 cm. The source was resistively heated and kept to a desired temperature of about 600 K for evaporation. The base pressure of the vacuum chamber was about $4 \times 10^{-9}$ Torr. During deposition the pressure rose to about $2.0 \times 10^{-8}$ Torr. The RHEED gun was operated at 8 kV and 0.2 mA emission current. A total of 200 RHEED patterns covering the azimuthal angle of 360° with a step of 1.8° was recorded for the pole figure measurements and took about 20 minutes. Details of the setup and operation of RHEED can be found in for example Tang et al., *Appl. Phys. Lett.* 89, 241903 (2006). The Mg deposition was interrupted at 0.5, 4.5, 8.5, 13.7, 24.5, 34.7, and 49.7 minutes for in situ RHEED pole figure measurements. The morphologies and structures of the final Mg films were imaged ex situ by a field emission SEM. The height of the Mg film obtained from the side view of SEM images was about 2.1 µm, rendering a growth rate of about 43 nm/minutes. The height refers to the vertical distance between the substrate and the Mg film surface. The thickness, or vertical height generally does not have a maximum value, and can range from for example about 500 nm to about 25 µm. The width refers to the dimension along the vapor flux direction, and generally can range for example from about 15 nm to about 80 nm, such as about 15 nm to about 30 nm. The length refers to the dimension perpendicular to both the thickness and the width, and generally can range from about 200 nm to about 2000 nm.

2.2 Results and Data Analysis

SEM Images

Figure 9:
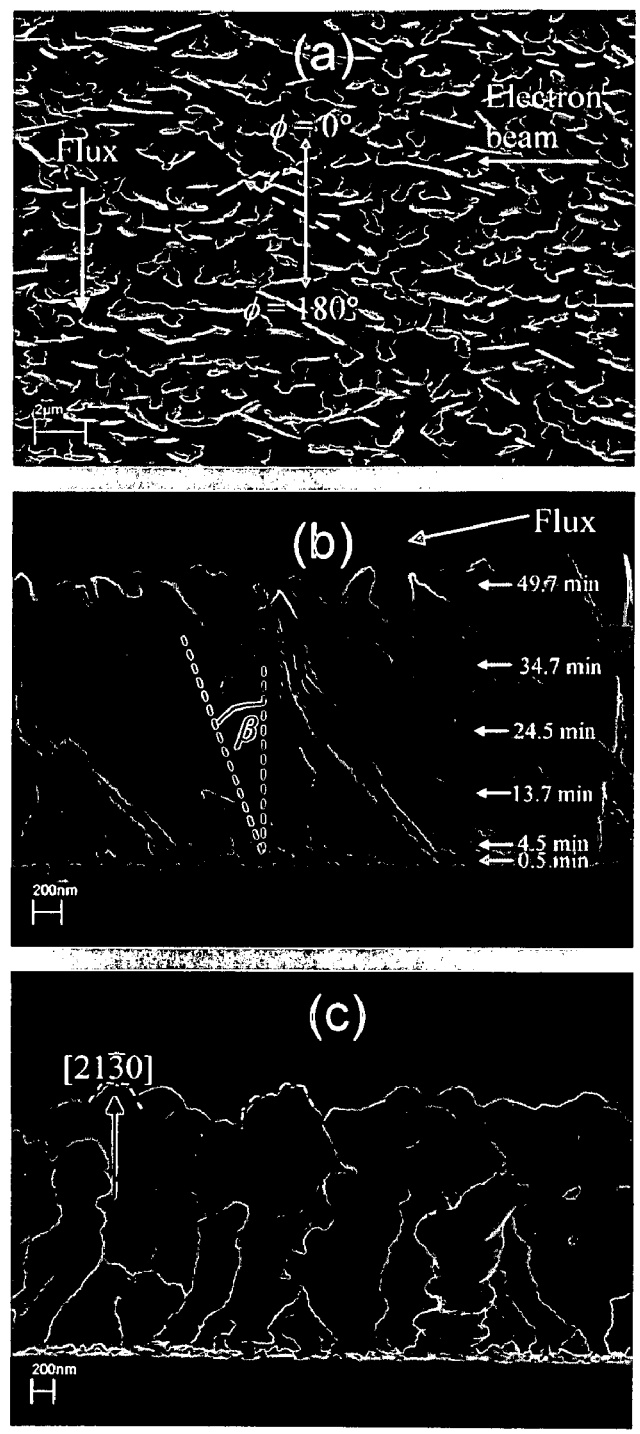
FIG. 9 shows (a) top view SEM image of nanoblades with about 49.7 minutes of deposition time (about 2.1 μm thick). The geometry of the RHEED measurement when the substrate at the azimuthal angle φ=0° (or 180°) is indicated. The incident electron beam direction and incident flux direction are 90° with respect to each other. φ is the azimuthal angle around the substrate normal. The electron beam is parallel to the wider width direction of nanoblades. (b) Side view SEM image of nanoblades viewed from the direction perpendicular to the incident flux direction. β is the nanoblade tilting angle measured from the substrate normal. The thicknesses corresponding to various deposition times are labeled by horizontal arrows. (c) A side view of the SEM image viewed from the direction parallel to the incident flux direction that is out of the page. The large surfaces of the nanoblade, facing away or towards the flux, are (0001) planes. The upward growth direction of a nanoblade is approximately along the [$2\bar{1}\bar{3}0$] axis.

OAD of Mg film can be generally significantly different from other materials because of the fast diffusion of the Mg atoms. FIGS. 9(*a*) through (*c*) show SEM images of the final Mg film deposited for 49.7 minutes at a vapor incident angle of 75°. The film is composed of many nanoblades (see FIG. 9(*a*)). The width of the typical Mg nanoblades along the incident vapor direction ranged from about 15 to about 30 nm, while the length perpendicular to the incident vapor direction can be as wide as a few hundred nanometers. The side view image in FIG. 9(*b*) shows that the nanoblades tilted away from the incident flux. The thicknesses corresponding to various deposition times are labeled by horizontal arrows in FIG. 9(*b*). The competitive growth among the nanoblades occurred during deposition, in which nanoblades with less tilting angle were favored. The top surfaces of less tilted nanoblades had brighter contrast (see FIG. 9(*a*)), indicating that these nanoblades grew taller and survived under the shadowing effect. FIG. 9(*c*) shows the SEM cross sectional image viewing parallel to the incident flux direction that is out of the page. From this image it can be seen that the shape of a nanoblade is polygon. The very upper part of a nanoblade shows a combination of multiple partial hexagons and is highlighted by dashed lines. This suggests that the large surfaces of the nanoblade, facing away or towards the flux, were (0001) planes. Additionally, the upward growth directions of nanoblades were approximately aligned along the [2$\bar{1}\bar{3}$0] direction. The surface normal of the (10$\bar{1}$0) plane, along the [2$\bar{1}\bar{3}$0] axis, was another preferred crystallographic orientation. The analysis of SEM images indicates the formation of a (10$\bar{1}$0)[0001] biaxial texture, which is consistent with the pole figure analysis.

RHEED Patterns and Pole Figure Analysis

RHEED Patterns

Figure 10:
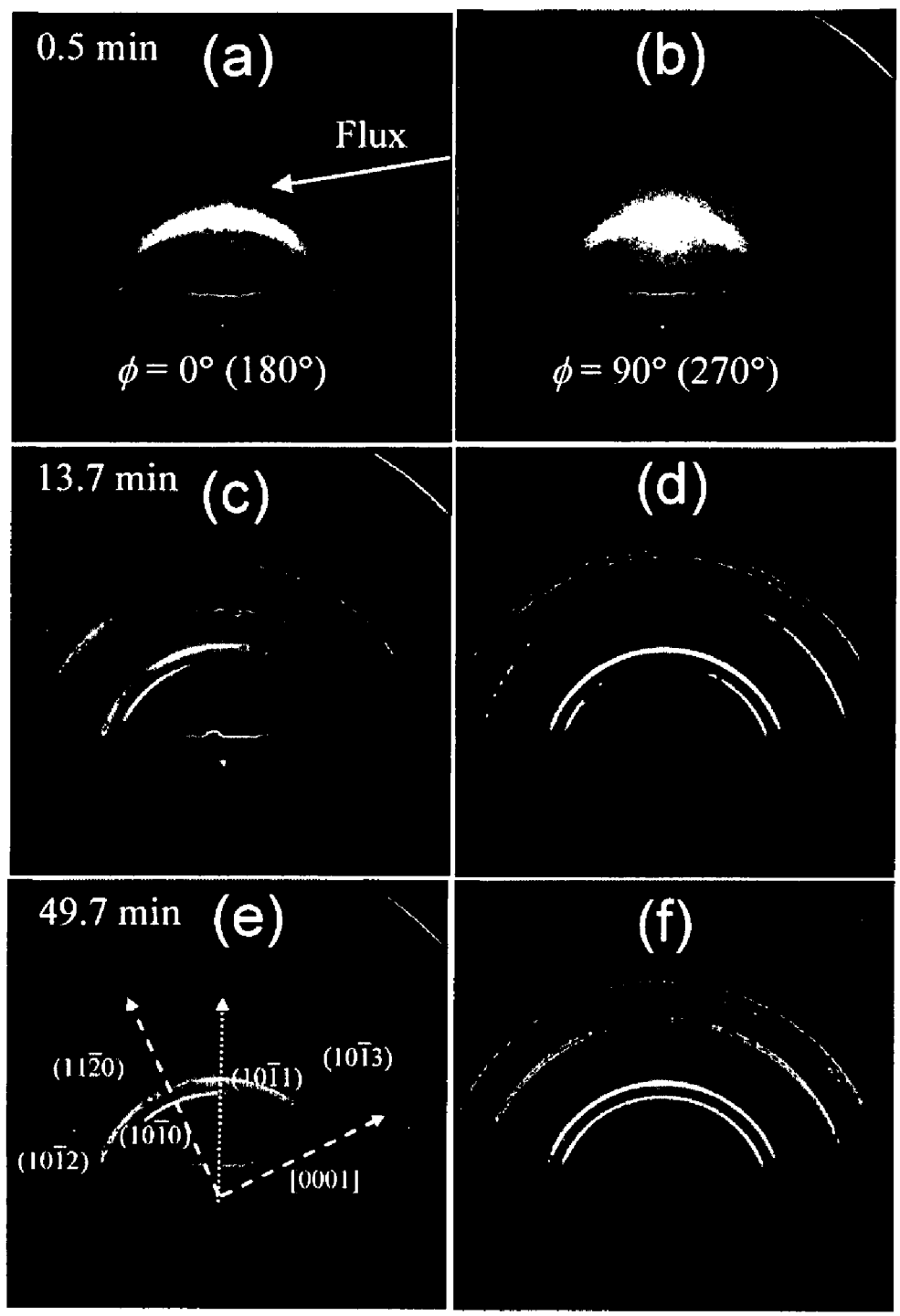
FIG. 10 shows RHEED patterns of Mg nanoblades when the electron beam is parallel to the wider width direction of nanoblades [sample position at φ=0° (or 180°)] and perpendicular to the wider width direction of nanoblades [sample position at φ=90° (or 270°)]. Phi (φ) is the azimuthal angle around the substrate normal. Portions (a) and (b) are for deposition time of 0.5 minutes (about 22 nm thick), portions (c) and (d) are for deposition time of 13.7 minutes (about 589 nm thick), and portions (e) and (f) are for deposition time of 34.7 minutes (about 1.49 μm thick). The normal of ($10\bar{1}0$) planes and the [0001] axis are indicated by the white long dashed lines with arrows in (e). The short dotted line with an arrow in (e) represents the normal of ($10\bar{1}1$) planes.

In the RHEED pole figure measurement, the substrate was rotated azimuthally with angle $\phi$ around the substrate normal while the directions of the vapor flux and electron beam were fixed at 90° to each other. The geometry of the RHEED measurement at an azimuthal angle $\phi$ of 0° (or 180°) is shown in FIG. 9(*a*), where the azimuthal angle $\phi$ of 0° (or 180°) was defined as parallel to the incident flux direction, and the direction of the incident electron beam is 90° with respect to the flux direction as a $\phi$ of 90° (or 270°). In this geometry the electron beam direction was parallel to the wider width direction of nanoblades. As the substrate was rotated, the $\phi$ angle changed with respect to the incident electron beam direction, indicating that the wider width direction of nanoblades was rotated with respect to the electron beam direction. FIG. 10 shows the RHEED images at selected deposition times of 0.5 minutes (about 22 nm thick), 13.7 minutes (about 589 nm thick), and 49.7 minutes (about 2.1 µm thick). FIGS. 10(*a*), 10(*c*), and 10(*e*) are patterns when the wider width direction of nanoblades is parallel to the electron beam [substrate positioned at $\phi=0°$ (or 180°)]. When the substrate was rotated to $\phi=90°$ (or 270°), the wider width direction of nanoblades was perpendicular to the electron beam direction. The corresponding RHEED images are shown in FIGS. 10(*b*), 10(*d*), and 10(*f*). FIGS. 10(*a*) and 10(*b*) show almost continuous and uniform diffraction rings appearing at the very initial stage of growth less than 0.5 minutes (about 22 nm thick), indicating a nearly random nucleation. With more deposition the diffraction rings became sharper and broke into more parts as shown in FIGS. 10(*c*) and 10(*e*), indicating texture formation. At the later stage of growth, it can be seen that when the wider width direction of nanoblades was parallel to the electron beam, the patterns became asymmetric about the substrate normal (see FIGS. 10(*c*) and 10(*e*)). This asymmetry resulted from the oblique angle incident vapor. The ratio between the various radii of the diffraction arcs in FIG. 10(*e*) is 1:1.14:1.45:1.72: 1.87, similar to that shown in FIG. 7(*d*). This ratio indicate that the diffraction arcs were from the (10$\bar{1}$0), (10$\bar{1}$1), (10$\bar{1}$2), (11$\bar{2}$0), and (10$\bar{1}$3) planes. The lattice constants a and c measured from the diffraction pattern were 3.2±0.1 and 5.2±0.2 Å, respectively. These measured values were close to the lattice constants of bulk Mg crystals, which were 3.21 and 5.21 Å, respectively. From the RHEED image analysis, it is seen that the (0002) diffraction arcs are missing. This could be due to the electron refraction effect originating from the inner potential of a crystal. The intensity of (0002) diffraction arcs mainly came from the electron beam parallel to the (0001) crystal surface. However, when the electron beam was nearly parallel to the crystal surface, the refraction effect became the strongest; an exemplary illustration is provided in for example Thomson et al., *Theory and Practice of electron Diffraction*, Macmillan, NY (1939). Almost no reflection is possible for which $G^2_{(0002)}/4k^2 < \phi/P$, where k is the wave vector of an electron beam, $G_{(0002)}$ the reciprocal wave vector of the (0002) plane, $\phi$ the inner potential, and P is the potential of an electron. Substitution of P=8000 V, k=45.82 Å$^{-1}$, and $G_{(0002)}$=2.41 Å$^{-1}$ into the above inequality showed that the inner potential of Mg was larger than 5.5 eV. Although a value of the inner potential of Mg was not found in the existing literature, most of the metals have been shown to have a value of the inner potential larger than 10 eV; see for example Vainshtein, *Structure Analysis by Electron Diffraction*, Macmillian, NY (1964).

Normalization of RHEED Pole Figure

Figure 11:
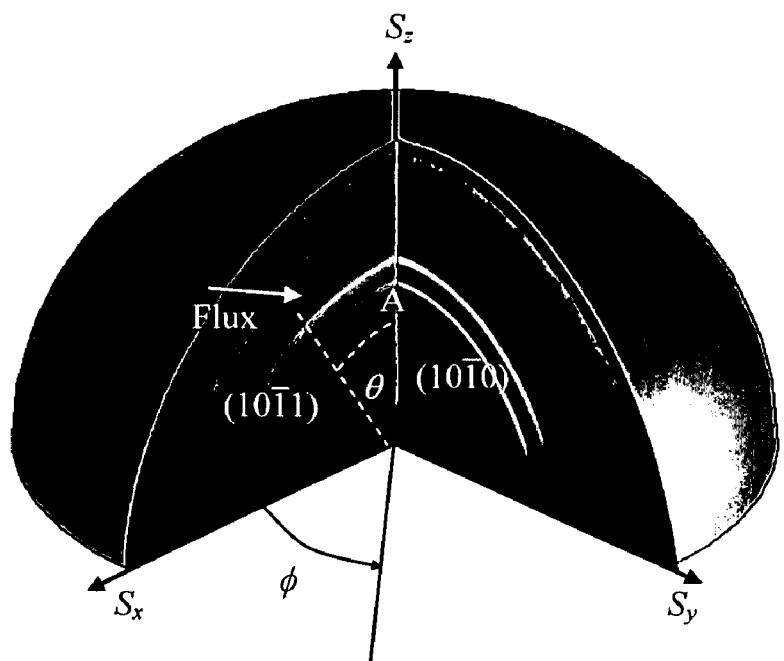
FIG. 11 illustrates (a) a 3D construction of the reciprocal space from the RHEED patterns of the Mg nanoblade film deposited for 49.7 minutes (about 2.1 μm thick). Point A on the S$_z$ axis is the cross point between the ($10\bar{1}0$) arcs. The polar angle θ is measured from the substrate normal S$_z$ axis. φ is the azimuthal angle around the substrate normal. (b) The plot of the intensity of point A vs the azimuthal angle φ.
Figure 11:
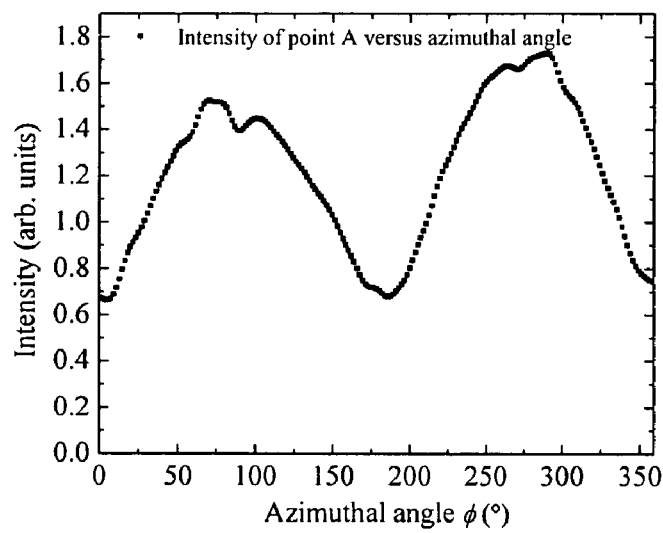

The morphology of the Mg film is generally very anisotropic. This anisotropic morphology can severely distort the RHEED pole figure, which is constructed from the polar intensity profiles at different azimuthal angles. A method of intensity normalization has been developed to account for this geometrical effect. For RHEED, a typical wave vector of the incident electron beam k is much larger than the interested reciprocal lattice vector G; therefore the Ewald sphere could be approximated as a plane. FIG. 11(a) shows a three-dimensional (3D) diagram of the constructed reciprocal space from the RHEED patterns of the Mg film deposited at 49.7 minutes (about 2.1 μm thick). Under the assumption that the Ewald sphere is approximated as a plane, the RHEED patterns at different azimuthal angles may have a common intersection line along the substrate normal (i.e., $S_z$ axis). Particularly, the point A on the $S_z$ axis is the cross point between the (10$\bar{1}$0) arcs. Although in theory the intensity of point A obtained from RHEED patterns at different azimuthal angles should have the same intensity, this intensity varied significantly with respect to the azimuthal angles, as shown in FIG. 11(b). The valley of the intensity plot was around $\phi=0°$ (or 180°), while the peak intensity was around $\phi=90°$ (or 270°). This intensity modulation in azimuthal angles was likely due to the anisotropic morphology of the film. From the SEM image, the film is seen to comprise well aligned nanoblades with the wider surface (face) perpendicular to the vapor flux. During the measurement, when an electron beam is incident parallel to the wider width direction of nanoblades, gaps between the nanoblade rows are exposed to the incident electrons that allow more electron channeling into the depth of the material. The channeled electrons can be captured in the bulk or contribute to the background, resulting in a weak intensity at $\phi=0°$ (or 180°). However, when an electron beam is perpendicular to the wider surface of nanoblades, $\phi=90°$ (or 270°), the electrons are perpendicular to the channeling gaps and the diffraction intensity becomes strongest. Both arguments are consistent with the observations from FIG. 11 (b).

Figure 12:
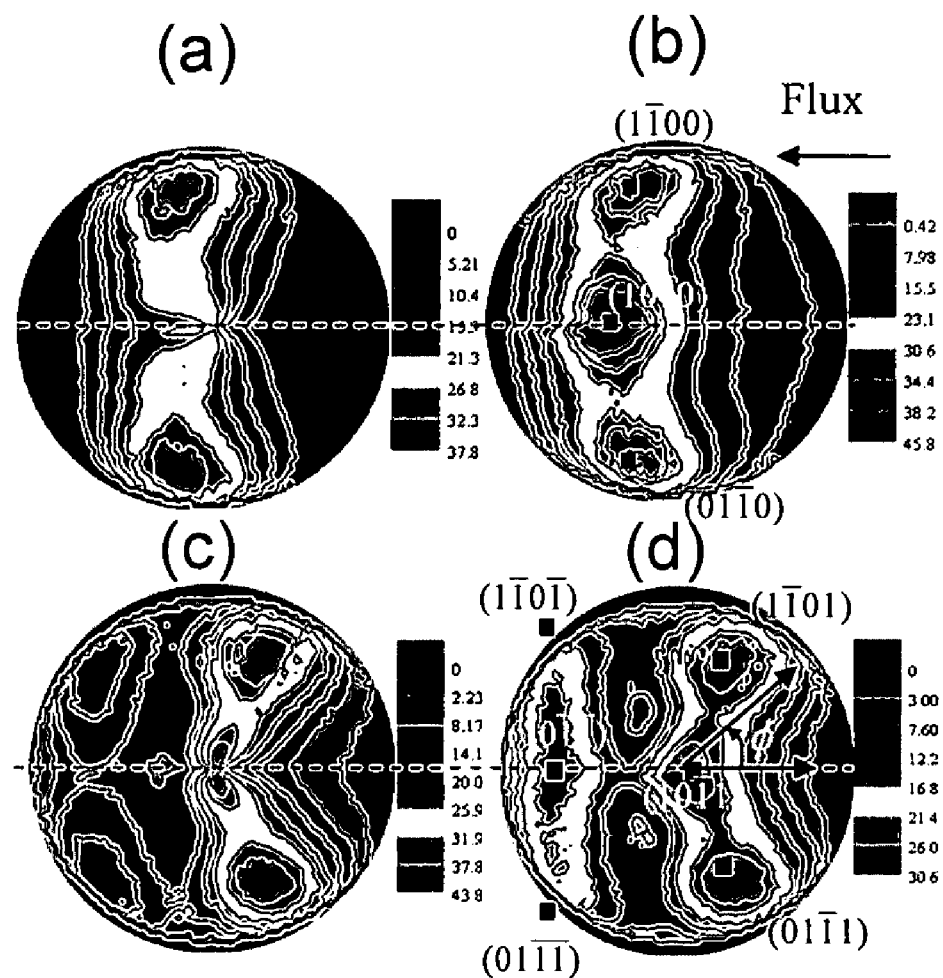
FIG. 12 shows the ($10\bar{1}0$) RHEED pole figures of the Mg nanoblade film with a deposition time about 49.7 minutes. (a) Before a normalization and (b) after a normalization; (c) and (d) show the corresponding ($10\bar{1}1$) RHEED pole figures before and after a normalization. The dashed line represents the azimuthal positions, where φ=0° (or 180°). The φ=0° means a direction towards the incident vapor flux and the $\phi=180°$ means a direction away from the incident vapor flux.

For compensating the intensity modulation around azimuthal angles, shown in FIG. 11(b), the intensity of point A from different RHEED images was normalized to a constant value. FIGS. 12(a) and 12(b) show the (10$\bar{1}$0) RHEED pole figures of the film deposited at 49.7 minutes before and after normalization, respectively. The intensity around $\phi=0°$ (or 180°), indicated by the dashed line, was obtained from RHEED images when the electron beam was incident parallel to the wider surface of the nanoblades. Before normalization, this intensity was significantly lower than the surroundings due to the intensity modulation described above. After normalization a center pole became visible along the dashed line. The pole structure suggests the formation of a biaxial texture. Through the analyses of the angles between different diffraction poles, a (10$\bar{1}$0)[0001] biaxial texture formation was observed in the Mg nanoblade film; an exemplary analysis method is provided in for example Tang et al., *Appl. Phys. Lett.* 89, 241903 (2006). The calculated positions of the diffraction intensity for this biaxial texture were superimposed on the top of FIG. 12(b) as solid squares.

A similar normalization process was followed by the construction of other pole figures. FIGS. 12(c) and 12(d) show the (10$\bar{1}$1) RHEED pole figures before and after the normalization, respectively. After normalization, the split center poles shown in FIG. 12(c) are merged into a single pole shown in FIG. 12(d). The positions of the individual poles match closely with the theoretical positions of (10$\bar{1}$0)[0001] biaxial texture. Since the diffraction intensity of the (10$\bar{1}$1) diffraction ring is always strong during the texture evolution, the analyses concentrate on the (10$\bar{1}$1) pole figure.

Evolution of Normalized RHEED Pole Figures

FIGS. 13(a) through 13(d) show a series of normalized (10$\bar{1}$1) RHEED pole figures after 0.5, 8.5, 24.5, and 34.7 minutes of deposition. In the beginning of 0.5 minutes of deposition, the distribution of intensity in the pole figure intensity was nearly even, indicating a random initial nucleation on the amorphous substrate. With more deposition at 8.5 minutes, an intense band was shown at the left side of the pole figure in FIG. 13(b). Clearly separated poles were revealed in the longer deposition time of 24.5 minutes (about 1.05 μm thick). The position of the poles in the figures moved towards the flux as the film grew. This indicates that the texture axes have tilted more towards the flux. This change of the texture axis can be quantitatively characterized by the evolution of polar intensity profiles, measured from RHEED images at $\phi=0°$ (or 180°). The plots are shown in FIG. 14(a). At the deposition time of 8.5 minutes (about 365 nm thick) the position of the peak with the maximum intensity was about $\theta=43°$ on the side at $\phi=180°$. As the film grew thicker, the peak position gradually moved to the center. At the deposition time of 49.7 minutes, the texture axis tilted to $\theta=1°$ on the side at $\phi=0°$. The inset of FIG. 14(a) presents that the texture axis tilting angle $\beta'_{(10\bar{1}1)}$ versus the deposition time t. The minus sign indicates that the texture axis tilts towards the incident vapor flux. It is seen from the figure that the texture axis tilting angle changes most dramatically at the early stage of growth.

In addition to the movement of the pole position, the (1$\bar{1}$01), (10$\bar{1}$1), and (01$\bar{1}$1) poles lie on a circular band can be observed (dashed curve) in FIG. 13(d). This circular band indicates that the variation of the azimuthal angle orientation was mainly around the [0001] axis. This is a natural consequence if considering that the (0001) plane is the major flux receiving surface. FIG. 14(b) shows the intensity versus the azimuthal angle around the [0001] axis or $\phi_{[0001]}$ at different deposition times. The $\phi_{[0001]}$ was around the dashed circle which went through (1$\bar{1}$01), (10$\bar{1}$1), and (01$\bar{1}$1) poles; an example is provided in FIG. 13(d). The center of the circle will be the geometrical position of the [0001] axis. This azimuthal plot is different from one that is around the center of the pole figure. Three peaks in the azimuthal plots correspond to these three poles. Due to the scattering from the particles present on the surface, some RHEED images within a narrow azimuthal angular region were severely distorted. This resulted in the spike observed in the center peak, which was most obvious in the curves of the early stage of growth labeled with arrows. However, the side peaks clearly show the shrinkage of the peak width from about 44° to about 27° during the film growth, indicating that the azimuthal angle orientation around the [0001] axis became more confined.

Texture Axis Tilting Angle

The pole figure analysis shows that the texture axes tilted more towards the incident vapor flux as the film grew. A similar change in the texture axis orientation was also observed in a CdS film by OAD; see for example Laermans et al., *Thin Solid Films* 15, 317 (1973); Hussain, *Thin Solid Films* 22 S5 (1974). The hexagonal shape of the nanoblades indicates that an individual nanoblade has a single crystal structure. This single crystal nature was also confirmed by transmission electron microscopy (TEM) analysis; see for example Tang et al., *Journal of Nanoscience and Nanotechnology* 7, 3239 (2007). Therefore, the variation of the texture axis tilting angle can be correlated to the change of the nanoblade tilting angle. This is consistent with the observations in the morphology of the final deposited film. From the SEM side view in FIG. 9(b), the competitive growth among nanoblades is revealed. At the early stage of deposition, nanoblades obviously tilted away from the substrate. For the nanoblades having large tilt angles, the growth directions would significantly deviate from the substrate normal, and therefore their vertical growth rates decrease and eventually stop growing. As a consequence, the texture axes would begin to tilt more towards the incident vapor flux during the growth. The tilting angle of the nanoblade $\beta$ can be assumed equal to the tilting angle of the $(10\bar{1}0)$ texture axis, $\beta'_{(10\bar{1}0)}$. The $\beta'_{(10\bar{1}0)}$ can be related to $\beta'_{(10\bar{1}1)}$ through $\beta'_{(10\bar{1}0)}=\beta'_{(10\bar{1}1)}+28.7°$. The 28.7° is the angle between the crystalline $(10\bar{1}0)$ and $(10\bar{1}1)$ planes. The final value of $\beta'_{(10\bar{1}1)}$ obtained from FIG. 13(a) is −1. Therefore the final value of $\beta'_{(10\bar{1}0)} \sim -1°+28.7°=27.7°$. The final tilting angle of nanoblades measured from FIG. 9(b) is $\sim(22\pm6)°$, which is comparable with the $\beta'_{(10\bar{1}0)}$ of 27.7°. In addition, the [0001] texture axis is tilted from surface normal by $\sim-(1°+61.3°)=-62.3°$, where the value of 61.3° is the angle between the crystalline $(10\bar{1}1)$ and $(0001)$ planes. Here the minus sign means that the texture axis tilts towards the incident vapor flux. The normal of $(10\bar{1}0)$ plane and the [0001] axis are labeled as long dashed lines with arrow heads in the RHEED pattern of FIG. 10(e). The short dotted line with an arrow head in (e) represents the normal of $(10\bar{1}1)$ plane.

Alignment of Azimuthal Angle Orientation

A number of arguments, including crystal geometries (see for example Tang et al., *Phys. Rev. B* 72, 035430 (2005); van der Drift, *Philips res. Rep.* 22, 267 (1974)), flux capture cross section (received flux) (see for example Chudzil et al., *IEEE Trans. Appl. Supercond.* 11, 3469 (2001)), and asymmetric surface diffusion (see for example Karpenko et al., *J. Appl. Phys.* 82, 1397 (1997)), have been presented in the literature to explain the azimuthal angle selection in films deposited by OAD, but a general theory to accurately predict the orientation selection has not emerged. In one embodiment, there are two extreme cases in the alignment of azimuthal angle orientation around the [0001] axis, as shown in FIGS. 15(a) and 15(b). The nanoblade was simplified as a hexagonal shape crystal and view along the [0001] axis. One was with the $[10\bar{1}0]$ axis along the vertical growth direction of the crystal [FIG. 15(a)]; the other was the $[2\bar{1}\bar{3}0]$ axis along the vertical growth direction of the crystal [FIG. 15(b)], which was observed in one embodiment. The [0001] axis was tilted away from the substrate normal under OAD. The first case has a sharp tip pointing up. By a geometrical consideration, the growth along a sharp tip (i.e., the $[10\bar{1}0]$ axis) can have a faster growth rate than the direction perpendicular to a crystal edge (i.e., $[2\bar{1}\bar{3}0]$ axis); see for example Tang et al., *Phys Rev. B* 72, 035430 (2006), which was contrary to the observation in one embodiment. The inconsistency can be resolved if the difference between flux capture cross sections of these two geometries was considered. Due to the shadowing effect, only the very upper part of crystals, for example, the shaded regions above the dashed horizontal lines, may be considered in the calculation of the received flux. In this case the crystal in FIG. 15(b) will have a much larger vapor flux capture cross section than that of the crystal shown in FIG. 15(a). Since the received flux was transported to the side faces in the thin blade structure, those crystals with the $[2\bar{1}\bar{3}0]$ axis along the vertical growth direction can have a higher vertical growth rate and survive. As an example, the capture cross section when the cut off position of the vapor flux was calculated and is labeled with the dashed horizontal lines in FIG. 15. The distance from the highest point of the crystal to the dashed line is l/2, where l is the crystal side length. The calculated flux capture cross section areas (the shaded regions) are $\sqrt{3}/4 l^2$ and $(2+1/\sqrt{3}/4)l^2$ in FIGS. 15(a) and 15(b), respectively. The area in FIG. 15(b) is about 1.49 higher than the area in FIG. 15(a).

Therefore, metal nanoblades with a large surface area can be produced by oblique angle deposition. These vertically freestanding nanoblades exhibit a $(10\bar{1}0)[0001]$ biaxial texture. The morphology of these nanoblades can be a function of the properties of the material and the deposition conditions. These nanoblades can be further coated with a catalyst for applications such as hydrogen storage.

The foregoing description of the embodiments of the invention has been presented for purposes of illustration and description. It is not intended to be exhaustive or to limit the invention to the precise form disclosed, and modifications and variations are possible in light of the above teaching or may be acquired from practice of the invention. The embodiments were chosen and described in order to explain the principles of the invention and as a practical application to enable one skilled in the art to utilize the invention in various embodiments and with various modification are suited to the particular use contemplated. It is intended that the scope of the invention be defined by the claims appended hereto and their equivalents.

What is claimed:

1. A method of making a nanostructure, comprising forming a plurality of magnesium nanoblades on a substrate by oblique angle vapor deposition.

2. The method according to claim 1, wherein the oblique angle vapor deposition is performed with an incident angle of 75 degrees.

3. The method according to claim 1, further comprising coating each of the nanoblades with a hydrogen storage catalyst.

4. The method according to claim 1, further comprising coating each of the nanoblades with a hydrogen storage catalyst selected from the group consisting of palladium, cobalt, platinum, niobium, and vanadium.

* * * * *